United States Patent
Gajanayake et al.

(10) Patent No.: US 11,412,642 B2
(45) Date of Patent: Aug. 9, 2022

(54) HEAT EXCHANGER

(71) Applicant: ROLLS-ROYCE plc, London (GB)

(72) Inventors: Chandana J. Gajanayake, Singapore (SG); Vivek Muthu, Singapore (SG); Pradip Chatterjee, Singapore (SG); Amit K. Gupta, Singapore (SG)

(73) Assignee: ROLLS-ROYCE plc, London (GB)

(*) Notice: Subject to any disclaimer, the term of this patent is extended or adjusted under 35 U.S.C. 154(b) by 258 days.

(21) Appl. No.: 16/831,886

(22) Filed: Mar. 27, 2020

(65) Prior Publication Data

US 2020/0315071 A1     Oct. 1, 2020

(30) Foreign Application Priority Data

Mar. 27, 2019    (GB) .................................... 1904215

(51) Int. Cl.
*H05K 7/20*       (2006.01)
*B64D 33/08*      (2006.01)
(Continued)

(52) U.S. Cl.
CPC ......... *H05K 7/20927* (2013.01); *B64D 33/08* (2013.01); *F28D 7/0033* (2013.01);
(Continued)

(58) Field of Classification Search
CPC .......... H05K 7/20927; H05K 7/20272; H05K 7/209; F28D 7/0033; F28D 7/022; F28D 7/02; F28D 2021/0026; F28D 2021/0028
See application file for complete search history.

(56) References Cited

U.S. PATENT DOCUMENTS

| | | | | |
|---|---|---|---|---|
| 2,321,185 A | * | 6/1943 | Christian | ............. B65G 33/265 |
| | | | | 415/72 |
| 2,456,775 A | * | 12/1948 | Fausek | .................... F28D 7/022 |
| | | | | 165/141 |

(Continued)

FOREIGN PATENT DOCUMENTS

| WO | 9530870 A1 | 11/1995 |
|---|---|---|
| WO | 2011079483 | 7/2011 |
| WO | WO-2020097333 A1 * | 5/2020 |

OTHER PUBLICATIONS

Great Britain search report dated Sep. 9, 2019, issued in GB Patent Application No. 1904215.9.

(Continued)

*Primary Examiner* — Jon T. Schermerhorn, Jr.
(74) *Attorney, Agent, or Firm* — Shumaker & Sieffert, P.A.

(57) ABSTRACT

A two-start helical heat exchanger comprises a helical baffle extending along a length of the heat exchanger and having first and second surfaces, wherein: the first surface of the baffle is arranged to provide a first helical fluid flow path for a first fluid; and the second surface of the baffle is arranged to provide a second helical fluid flow path for a second fluid, wherein the second fluid flow path is arranged in counter-flow with the first fluid flow path and a casing within which the baffle is mounted. The baffle is arranged such that first and second fluid flow paths are in thermal contact with each other through the baffle, and in thermal contact with the casing. The heat exchanger may be incorporated into a power converter, for example to cool the power converter. The heat exchanger may be used on an aircraft.

10 Claims, 7 Drawing Sheets

(51) Int. Cl.
  *F28D 7/02* (2006.01)
  *F28D 7/00* (2006.01)
  *F28F 7/02* (2006.01)
  *F28D 21/00* (2006.01)

(52) U.S. Cl.
  CPC .............. *F28D 7/022* (2013.01); *F28F 7/02* (2013.01); *H05K 7/209* (2013.01); *H05K 7/20272* (2013.01); *F28D 2021/0026* (2013.01); *F28D 2021/0028* (2013.01); *F28D 2021/0029* (2013.01); *F28D 2021/0087* (2013.01)

(56) References Cited

U.S. PATENT DOCUMENTS

| | | | | |
|---|---|---|---|---|
| 3,548,926 | A * | 12/1970 | Archer | B65G 33/18 165/92 |
| 3,923,097 | A * | 12/1975 | Hovad | F26B 23/10 165/92 |
| 5,074,057 | A * | 12/1991 | Kanai | F26B 11/14 34/166 |
| 5,964,278 | A * | 10/1999 | Langoy | F28G 3/10 165/95 |
| 10,012,810 | B2 * | 7/2018 | Sanders | G02B 6/3813 |
| 10,434,483 | B2 * | 10/2019 | Wenger | B01F 27/2721 |
| 2008/0216461 | A1 | 9/2008 | Nakano et al. | |
| 2012/0186792 | A1 * | 7/2012 | Semmes | F28D 7/026 165/109.1 |
| 2014/0261700 | A1 * | 9/2014 | Klein | F24H 1/162 137/341 |
| 2015/0300745 | A1 * | 10/2015 | Kolb | F28D 7/022 165/184 |
| 2018/0283795 | A1 * | 10/2018 | Cerny | F28D 1/0472 |
| 2019/0011190 | A1 | 1/2019 | Kolb | |
| 2019/0182991 | A1 * | 6/2019 | Muthu | H01L 23/373 |

OTHER PUBLICATIONS

Response to Extended European Search Report from counterpart EP Application No. 20165916.6 dated Aug. 5, 2020, filed Feb. 19, 2021, 10 pgs.

Supplemental Response to Extended European Search Report from counterpart EP Application No. 20165916.6 dated Aug. 5, 2020, filed Mar. 26, 2021, 49 pgs.

European search report dated Jul. 27, 2020, issued in EP20165916.6.

* cited by examiner

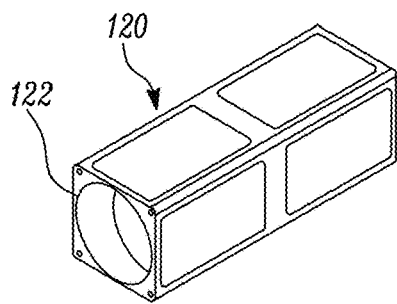
FIG. 5A
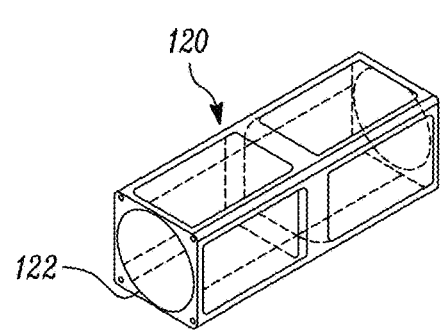
FIG. 5B
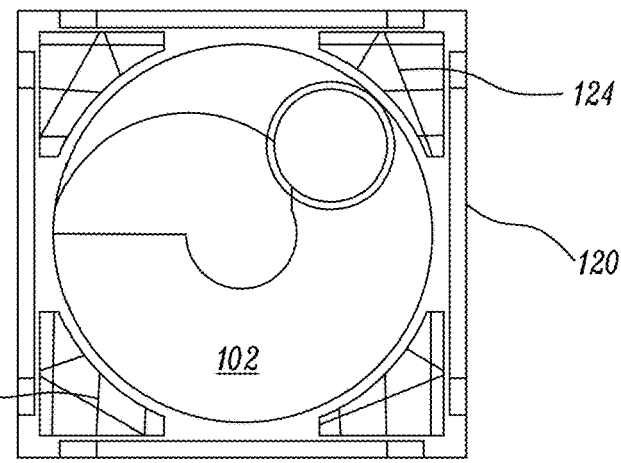
FIG. 6
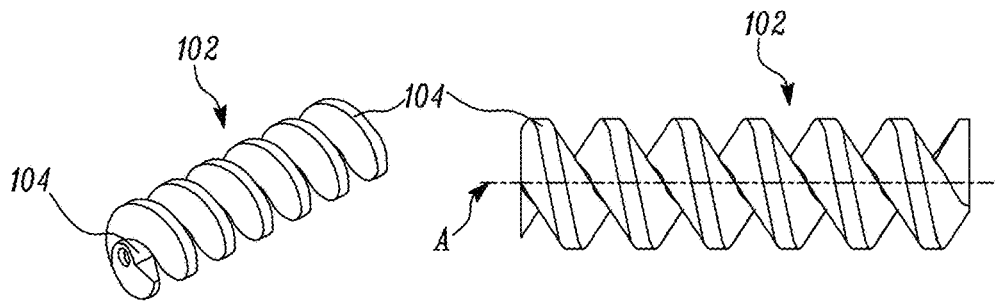
FIG. 7A
FIG. 7B
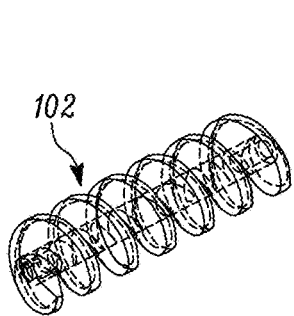
FIG. 8A
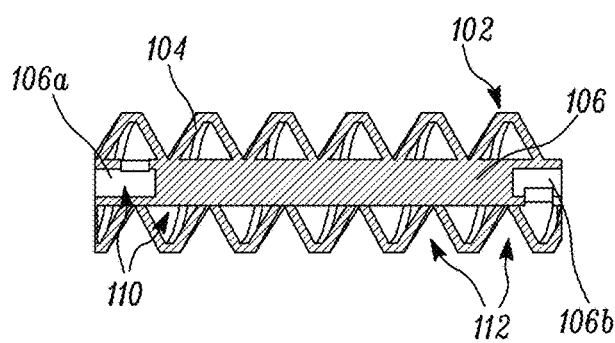
FIG. 8B

HEAT EXCHANGER

CROSS-REFERENCE TO RELATED APPLICATIONS

This specification is based upon and claims the benefit of priority from UK Patent Application Number 1904215.9 filed on 27 Mar. 2019, the entire contents of which are incorporated herein by reference.

BACKGROUND

Technical Field

The present disclosure relates to a heat exchanger comprising a helical baffle, and more particularly, but not exclusively, to a heat sink comprising a helical baffle and designed to dissipate heat from an electrical component, for example a power converter. In particular, but not exclusively, the heat exchanger may be used in thermal management of power electronics, and/or in aerospace applications, such as cooling of components and/or fluids on an aircraft, and for example in an electric, hybrid, or More Electric Aircraft.

Description of the Related Art

Issues with existing heat exchangers, such as heat sinks, include the high weight and lack of compactness, which may be of particular concern for aerospace or automobile applications, and also fire risk. The skilled person would appreciate that fire risk presents specific problems in aerospace, where the available coolant fluid is often flammable (e.g. fuel or lubricant oil). In aerospace applications, there are generally limitations on the type of fluid available for use as a coolant—aircraft lubricant oil or aviation fuel is often used due to its availability, but these fluids have relatively poor thermal conductivities (in addition to flammability issues), so known designs may not allow for sufficient heat transfer. Furthermore, cooling may be difficult to provide, as the coolant heats up as it flows through the heat exchanger, potentially leading to the formation of hot spots.

The skilled person would appreciate that pursuing More Electric Aircraft (MEA) technology may require complex power electronics for the conversion of power from generators to meet the required loads. Thermal management may therefore have an important role in the protection of power converters from overheating. The ability to use turbine lubricant oil and/or aviation fuel as coolants may be beneficial.

Below, aspects and embodiments of the present disclosure are described primarily in relation to cooling applications (e.g. heat sinks)—the skilled person would appreciate that the heat exchange system described may equivalently be used for heating as the direction of heat transfer can be reversed. The skilled person would appreciate that the term "coolant" may be used for a heat exchange fluid whether it is being used for heating or cooling.

Below, aspects and embodiments of the present disclosure are described primarily in relation to cooling a power converter. The skilled person would appreciate that the heat exchanger of various embodiments may be arranged to cool (or heat) other items and/or fluids, as appropriate.

SUMMARY

According to a first aspect there is provided a two-start helical heat exchanger comprising a helical baffle extending along a length of the heat exchanger and having first and second surfaces, and a casing within which the baffle is mounted. The first surface of the baffle is arranged to provide a first helical fluid flow path for a first fluid; and the second surface of the baffle is arranged to provide a second helical fluid flow path for a second fluid. The second fluid flow path is arranged in counter-flow with the first fluid flow path.

The baffle is arranged such that first and second fluid flow paths are in thermal contact with each other through the baffle, and in thermal contact with the casing.

The first and second fluid flow paths are separate/independent such that the fluids flowing within the flow paths in use do not mix.

The heat exchanger may function as a fluid-to fluid heat exchanger with heat exchange between the first and second fluid flow paths.

Additionally or alternatively, the heat exchanger may function as a heat source or heat sink for an external object or fluid. In embodiments in which the heat exchanger functions as a heat source or heat sink, the casing is made of a thermally conductive material and may be described as a heat spreader.

The helical baffle may be hollow. The first surface of the baffle may be the interior surface of the baffle, such that the hollow interior of the baffle provides the first fluid flow path.

The second surface of the baffle may be the exterior surface of the baffle, such that the second fluid flow path is provided between the baffle and the casing.

The first fluid flow path may be within the baffle and the second fluid flow path may be around the baffle.

The first fluid may be a flammable fluid and the second fluid may be a non-flammable fluid. For example, the first fluid may be aviation fuel or oil and/or the second fluid may be water.

The helical baffle may comprise a solid cylindrical core. The cylindrical core may be encircled by a hollow thread. The hollow thread may provide the first fluid flow path.

A space between the helical baffle and the casing may provide the second fluid flow path.

The casing may comprise a channel therethrough. The channel may be cylindrical. The helical baffle may be received within the channel. The channel and the baffle together may define the second fluid flow path.

The helical baffle may comprise a single helical thread. The single thread may be hollow and may provide the first fluid flow path.

The helical baffle may comprise first and second helical threads.

The helical baffle may comprise first and second hollow helical threads. The interior of the first and second hollow threads may provide the first and second flow path, respectively.

The helical baffle may comprise first and second helical threads which are not hollow. The first and second flow paths may be provided by first and second channels defined by spaces between the first and second helical threads and the casing. The casing may comprise a channel therethrough, and the helical baffle may be received within the channel such that the channel and the baffle together define the first and second fluid flow paths.

The casing may be a heat spreader.

The heat exchanger may be a heat sink arranged to cool an object or component outside of the casing, such as a power converter.

According to a second aspect, there is provided a power converter comprising a heat exchanger, wherein the heat exchanger is arranged to serve as a heat sink to cool the power converter. The heat exchanger is as described for the preceding aspect.

According to a third aspect, there is provided a gas turbine engine for an aircraft comprising:

an engine core comprising a turbine, a compressor, and a core shaft connecting the turbine to the compressor;

a fan located upstream of the engine core, the fan comprising a plurality of fan blades;

a gearbox that receives an input from the core shaft and outputs drive to the fan so as to drive the fan at a lower rotational speed than the core shaft;

and at least one of:

(i) a power converter, and a heat exchanger as described in the first aspect, wherein the heat exchanger is arranged to serve as a heat sink to cool the power converter; and/or (ii) a power converter as described in the second aspect.

Heat exchangers such as that described above and claimed in the appended claims, using a fluid coolant, may be described as liquid cooling systems (when used for cooling). The skilled person would appreciate that the heat transfer by convection offered by liquid cooling systems may provide a lower thermal resistance as compared to solid state cooling solutions relying on conduction.

The skilled person would appreciate that heat exchangers of embodiments of the invention may also reduce or overcome various limitations associated with liquid cooling systems, such as pumping power requirements, pumping storage weight, system pressure drops, turbulence in the cold plate used for the heat transfer, space occupied by the cold plate, and the likes, as is discussed in more detail below.

For example, in the embodiments described, a dual coolant loop for counter-flow of the first and second fluids is provided, at least in part, by a single component design—the baffle defines (at least in part) both flow paths, so providing a compact design.

Further, conjugate heat transfer happening between the first and second fluids in the counter-flow loop is facilitated by the thermally-conductive baffle which is in contact with both fluids along the length of the heat exchanger.

In addition, the counter-flow heat exchanger using a dual coolant flow may improve the momentum diffusivity (also referred to as kinematic viscosity) of low thermal conductivity fluids like oil or fuel as compared to known heat exchangers. The skilled person would appreciate that the Prandtl number for oil is much greater than one, thus momentum diffusivity may dominate, and that the heat exchanger design of various embodiments may increase the velocity of the flow using the helical flow path.

Improved heat transfer performance may therefore be provided even when using a coolant with a relatively low thermal conductivity.

The counter flow arrangement may increase the heat transfer coefficient and/or even out the temperature distribution along the length of the heat exchanger. Heat exchanger designs of various embodiments may address the issue of coolant temperature rise along the length of the heat exchanger by introducing one coolant at each end of the heat exchanger in a counter flow arrangement. The skilled person would appreciate that coolant temperature rise along a heat exchanger may be of particular importance when highly viscous coolants are used.

Further, embodiments in which one coolant is contained within the helical baffle (the inner coolant), with a second coolant surrounding the baffle (the outer coolant), may improve safety in some embodiments—for example, oil or fuel may be used as the inner coolant and a non-flammable coolant such as water used as the outer coolant for safety purposes. Fault tolerance may be improved in such embodiments.

In addition to the fluid-to-fluid heat transfer, a heat source thermally connected to the heat exchanger may be cooled—the heat exchanger may be referred to as a heat sink in such embodiments. The internal fluid-to-fluid heat transfer may facilitate maintaining a more even temperature profile along the length of the heat sink, so potentially reducing the likelihood of hot-spots being formed.

The skilled person would appreciate that the same heat exchanger may be arranged to cool one of the two fluids, using the other fluid, and/or to cool (or heat) an external heat source, using both fluids.

Further, the helical paths taken by both fluids may facilitate maintaining a more even temperature profile around the heat exchanger.

The skilled person would appreciate that fluid flow path design has a direct impact on pumping requirements for a liquid cooling system, and that having a lower pressure drop across the heat exchanger may reduce pumping requirements. As known cold plate heat sinks generally use smaller diameter tubes in serpentine forms, there is generally a relatively large pressure drop along a relatively long flow path, which may increase power/pumping requirements. The skilled person would appreciate that pressure drop may be a particular concern in aerospace applications in which highly-viscous fluids such as aviation fuel or lubricant oil are often used—pressure drop generally increases for more viscous fluids.

The use of wider and/or less serpentine flow paths may therefore reduce pressure drop, and so reduce pumping requirements.

For example, (smaller) tubes in known cold plates generally have diameters in the range 8-12 mm (and therefore a flow area of around 50-115 mm$^2$, i.e. $1.1 \times 10^{-4}$ m$^2$ or less); the skilled person would appreciate that the size may be constrained due to the manufacturability of copper tubes and assembly with aluminium plates. AAVID cold plates (available from Boyd Corporation: https://www.boydcorp.com/thermal/liquid-cooling/liquid-cold-plates.html) and Lytron cold plates (http://www.lytron.com/Cold-Plates/Standard) are examples of such cold plates. By contrast, the diameter of a tube forming the casing of the helical baffle may be between 3 cm and 30 cm, optionally between 3 cm and 15 cm, and further optionally around 7 cm. The flow path cross-sectional area for a coolant between the baffle and the casing may be between 0.001 m$^2$ and 0.012 m$^2$, and optionally around 0.008 m$^2$ (8000 mm$^2$). The flow path cross-sectional area for a coolant within the baffle similarly be between 0.001 m$^2$ and 0.012 m$^2$, and optionally may be around 0.006 m$^2$. The flow areas for each coolant may be equal in some embodiments. The flow areas for each coolant may therefore be over 10, 20, 50 or 100 times greater than flow areas of standard serpentine cold plates in various embodiments.

Similarly, flow path lengths in such known designs for a single 300 mm length cold plate are generally around 1.2 m for a four-pass arrangement and around 1.8 m for a six-pass arrangement. By contrast, for a 300 mm length heat exchanger of an embodiment described herein, the flow path length may be less than 1 metre, and optionally around 750 mm (0.75 m).

Embodiments may offer an improved heat transfer coefficient, particularly when using aero-lubricant oil or another viscous fluid as coolant, due to the improved flow dynamics and the compact casing/heat spreader design described in more detail below.

For example, a smaller (and potentially negligible) pressure drop across the heat exchanger may be provided as compared to known systems, particularly when using a highly viscous coolant such as lubricant oil. The reduction in pressure drop may be due to the increased width of the fluid flow path, the diameter of the helical baffle, and the selected pitch and number of revolutions of the helical baffle—the skilled person would appreciate that increased flow path width may contribute majorly to the pressure drop reduction in various embodiments. Appropriate values for these may be derived from fluid simulations for a given coolant, available space, and cooling/heating load. For example, in various embodiments, the following dimensions may be used for the helical baffle:

Coil diameter (outer diameter of the helical baffle/the inner diameter of the casing)—between 2 cm and 20 cm, and optionally 4.3 cm (1.7");

Pitch: between 2 cm and 10 cm, and optionally 3.45 cm (1.36"): and

Number of revolutions: between 4 and 15, and optionally 7.

The baffle is arranged such that first and second fluid flow paths are in thermal contact with each other through the baffle, and in thermal contact with the casing. In embodiments in which one or both fluid flow paths are inside a hollow baffle, the thermal contact of the or each fluid within the baffle with the casing is by conduction through the baffle. The baffle material may be chosen to have a high thermal conductivity. In embodiments in which one or both fluid flow paths are outside of the baffle (which may or may not be hollow), the or each fluid on such a path may be in direct contact with the casing, so allowing for direct thermal transfer from the fluids to the casing. Some heat may also be conducted via the baffle—using a thermally conductive material for the baffle would facilitate this heat transfer. The skilled person would appreciate that thermal contact of both fluids with the casing may be of particular utility in embodiments in which the casing is arranged to act as a heat spreader. Thermal contact of one fluid with the other may facilitate even heat transfer.

In various embodiments, the helical flow path may allow cooling to be provided in multiple positions around the heat exchanger. For example, in embodiments in which the casing is cuboid in shape, the outer surface of the casing may provide four planes on which cooling may be provided. In some embodiments, all six planes of the cuboid casing may be used for cooling, or only three of the four faces parallel to an axis of the cuboid may be used (with the fourth optionally being used as a base). Items, components and/or fluids to be cooled (or heated) may therefore be assembled all around the flow path, which may allow for more efficient, and/or more easily tailored, packaging, and may reduce volume and/or weight of the final arrangement. By contrast, known cold plates provide single plane cooling.

Mounting of known cold plates for power converter applications requires additional support structures, which adds weight to the system—by contrast, in various embodiments, the baffle is mounted on the casing of the heat exchanger (which may be or comprise a heat spreader or base plate of the heat exchanger), and the components to be cooled may also be mounted on the casing. The casing may therefore provide the mounting in addition to defining (at least in part) at least one of the flow paths, so potentially reducing the number and/or weight of components. Further, in some embodiments, one or more coolant pipes extending from the baffle may be used to mount the baffle on the casing—the pipes may be arranged to be received in corresponding apertures or pipes of the casing, or to receive corresponding pipes or protrusions of the casing, so as to mount the baffle on the casing. No extra or separate support or mounting components may therefore be required, potentially reducing the number of system components and/or reducing system size and/or weight. In some embodiments, the baffle may be formed integrally with the casing.

The skilled person would appreciate that turbulence may also affect the heat transfer properties of the heat exchanger, particularly for high-viscosity coolants—optimising the turbulence may therefore improve the heat transfer properties of the heat exchanger.

For example, in the embodiments being described, helical flow paths are provided for the fluids. The use of a helical path may induce turbulence in the fluid—the helical flow path may therefore be described as a turbulent flow path. The turbulence may be particularly beneficial in embodiments using viscous coolants, such as oil, as the increased mixing may help to keep the fluid at a more even temperature at a given position along the heat exchanger. The dimensions of the helical flow paths and the mass flow rate of each fluid along its flow path may be selected to increase or optimise this turbulence and resultant mixing.

The hollow helical flow path may impart multiple flow lines in the single pass flow to produce the desired turbulence for the heat transfer.

The skilled person would appreciate that the heat exchanger design described herein may provide lightweight, compact, and/or low thermal resistance heat exchangers, e.g. heat sinks. In particular, a lightweight, compact, low thermal resistance heat sink suitable for use with power electronics, for cooling using dual coolant sources, may be provided.

The heat exchanger may be referred to as a dual-cool/dual-use heat exchanger.

The casing design disclosed herein may provide one or more of the following advantages in various embodiments.

The casing disclosed herein may be relatively lightweight and compact in comparison to known base plates and the likes, potentially reducing the volume of the heat exchanger by 10% and weight by 60%, for example, for the same level of cooling (or heating).

The casing may also fulfil the role of the heat spreader, or base plate, for the heat exchanger in some embodiments as it may conduct heat between a heat source and a heat sink (one of which being the fluids within the heat exchanger, the other of which being external thereto). In such embodiments, the casing may be made of a thermally conductive material such as a metal. The dual-function casing-heat spreader may take the place of two separate components of various known systems.

As the heat spreader extends around the helical baffle, heat dissipating devices may be arranged all around the baffle. For example, for a heat spreader which is substantially cuboid in shape, heat dissipating devices can be arranged on all four sides of the heat spreader, along the length of the heat exchanger. This may provide more efficient and/or more even heat exchange than in various known systems.

Grooves or indentations may be provided on the heat spreader/casing in various embodiments—these may help to reduce the thermal impedance between the heat dissipating devices around the heat spreader and coolant flow inside the heat spreader. The grooves or indentations may be arranged to receive one or more power electronic devices in some embodiments, so facilitating and guiding assembly.

The heat spreader may be referred to as a base plate, and may be made of aluminium.

In embodiments in which a heat exchanger as described herein is integrated with a power converter, the power density of the converter may be increased as compared to power converters with prior art heat exchangers due to the reduction in volume and/or mass of the heat exchanger. Power density of the converter may be defined as the ratio of power handled by the converter to the volume, or to the (dry) weight of the converter (kW/l or kW/kg).

In some embodiments, the casing/base plate may be hollow, and may be partially or completely filled with a thermally conducting material. The thermally conducting material may contribute to the thermal distribution of the heat exchanger, improving the heat spreading performance of the casing. At least one coolant (e.g. the outer coolant) may be in contact with an inner surface of the casing, so facilitating heat transfer to (or from) the heat spreader.

As noted elsewhere herein, the present disclosure may relate to a gas turbine engine. Such a gas turbine engine may comprise an engine core comprising a turbine, a combustor, a compressor, and a core shaft connecting the turbine to the compressor. Such a gas turbine engine may comprise a fan (having fan blades) located upstream of the engine core.

Arrangements of the present disclosure may be particularly, although not exclusively, beneficial for fans that are driven via a gearbox. Accordingly, the gas turbine engine may comprise a gearbox that receives an input from the core shaft and outputs drive to the fan so as to drive the fan at a lower rotational speed than the core shaft. The input to the gearbox may be directly from the core shaft, or indirectly from the core shaft, for example via a spur shaft and/or gear. The core shaft may rigidly connect the turbine and the compressor, such that the turbine and compressor rotate at the same speed (with the fan rotating at a lower speed).

The gas turbine engine as described and/or claimed herein may have any suitable general architecture. For example, the gas turbine engine may have any desired number of shafts that connect turbines and compressors, for example one, two or three shafts. Purely by way of example, the turbine connected to the core shaft may be a first turbine, the compressor connected to the core shaft may be a first compressor, and the core shaft may be a first core shaft. The engine core may further comprise a second turbine, a second compressor, and a second core shaft connecting the second turbine to the second compressor. The second turbine, second compressor, and second core shaft may be arranged to rotate at a higher rotational speed than the first core shaft.

In such an arrangement, the second compressor may be positioned axially downstream of the first compressor. The second compressor may be arranged to receive (for example directly receive, for example via a generally annular duct) flow from the first compressor.

The gearbox may be arranged to be driven by the core shaft that is configured to rotate (for example in use) at the lowest rotational speed (for example the first core shaft in the example above). For example, the gearbox may be arranged to be driven only by the core shaft that is configured to rotate (for example in use) at the lowest rotational speed (for example only be the first core shaft, and not the second core shaft, in the example above). Alternatively, the gearbox may be arranged to be driven by any one or more shafts, for example the first and/or second shafts in the example above.

The gearbox may be a reduction gearbox (in that the output to the fan is a lower rotational rate than the input from the core shaft). Any type of gearbox may be used. For example, the gearbox may be a "planetary" or "star" gearbox, as described in more detail elsewhere herein. The gearbox may have any desired reduction ratio (defined as the rotational speed of the input shaft divided by the rotational speed of the output shaft), for example greater than 2.5, for example in the range of from 3 to 4.2, or 3.2 to 3.8, for example on the order of or at least 3, 3.1, 3.2, 3.3, 3.4, 3.5, 3.6, 3.7, 3.8, 3.9, 4, 4.1 or 4.2. The gear ratio may be, for example, between any two of the values in the previous sentence. Purely by way of example, the gearbox may be a "star" gearbox having a ratio in the range of from 3.1 or 3.2 to 3.8. In some arrangements, the gear ratio may be outside these ranges.

In any gas turbine engine as described and/or claimed herein, a combustor may be provided axially downstream of the fan and compressor(s). For example, the combustor may be directly downstream of (for example at the exit of) the second compressor, where a second compressor is provided. By way of further example, the flow at the exit to the combustor may be provided to the inlet of the second turbine, where a second turbine is provided. The combustor may be provided upstream of the turbine(s).

The or each compressor (for example the first compressor and second compressor as described above) may comprise any number of stages, for example multiple stages. Each stage may comprise a row of rotor blades and a row of stator vanes, which may be variable stator vanes (in that their angle of incidence may be variable). The row of rotor blades and the row of stator vanes may be axially offset from each other.

The or each turbine (for example the first turbine and second turbine as described above) may comprise any number of stages, for example multiple stages. Each stage may comprise a row of rotor blades and a row of stator vanes. The row of rotor blades and the row of stator vanes may be axially offset from each other.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the Figures, in which:

FIGS. 5A and 5B are solid and transparent views of the casing of the heat sink shown in FIG. 4;

FIG. 6 is a cross-sectional end view through the baffle and casing of the heat sink shown in FIG. 4;

FIGS. 7A and 7B are perspective and side solid views of the helical baffle of the heat sink shown in FIG. 4;

FIG. 8A is a transparent perspective view of the helical baffle of the heat sink shown in FIG. 4;

FIG. 8B is a cross-sectional side view of the helical baffle of the heat sink shown in FIG. 4;

DETAILED DESCRIPTION

Figure 1:
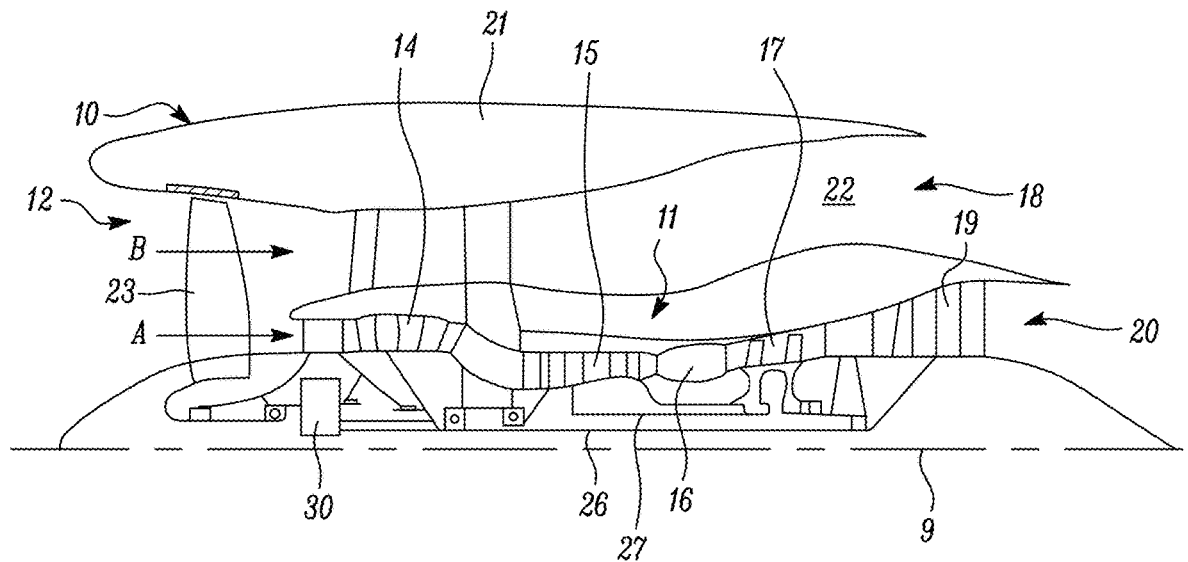
FIG. 1 is a sectional side view of a gas turbine engine.

FIG. 1 illustrates a gas turbine engine 10 having a principal rotational axis 9. The engine 10 comprises an air intake 12 and a propulsive fan 23 that generates two airflows: a core airflow A and a bypass airflow B. The gas turbine engine 10 comprises a core 11 that receives the core airflow A. The engine core 11 comprises, in axial flow series, a low pressure compressor 14, a high-pressure compressor 15, combustion equipment 16, a high-pressure turbine 17, a low pressure turbine 19 and a core exhaust nozzle 20. A nacelle 21 surrounds the gas turbine engine 10 and defines a bypass duct 22 and a bypass exhaust nozzle 18. The bypass airflow B flows through the bypass duct 22. The fan 23 is attached to and driven by the low pressure turbine 19 via a shaft 26 and an epicyclic gearbox 30.

In use, the core airflow A is accelerated and compressed by the low pressure compressor 14 and directed into the high pressure compressor 15 where further compression takes place. The compressed air exhausted from the high pressure compressor 15 is directed into the combustion equipment 16 where it is mixed with fuel and the mixture is combusted. The resultant hot combustion products then expand through, and thereby drive, the high pressure and low pressure turbines 17, 19 before being exhausted through the nozzle 20 to provide some propulsive thrust. The high pressure turbine 17 drives the high pressure compressor 15 by a suitable interconnecting shaft 27. The fan 23 generally provides the majority of the propulsive thrust. The epicyclic gearbox 30 is a reduction gearbox.

Figure 2:
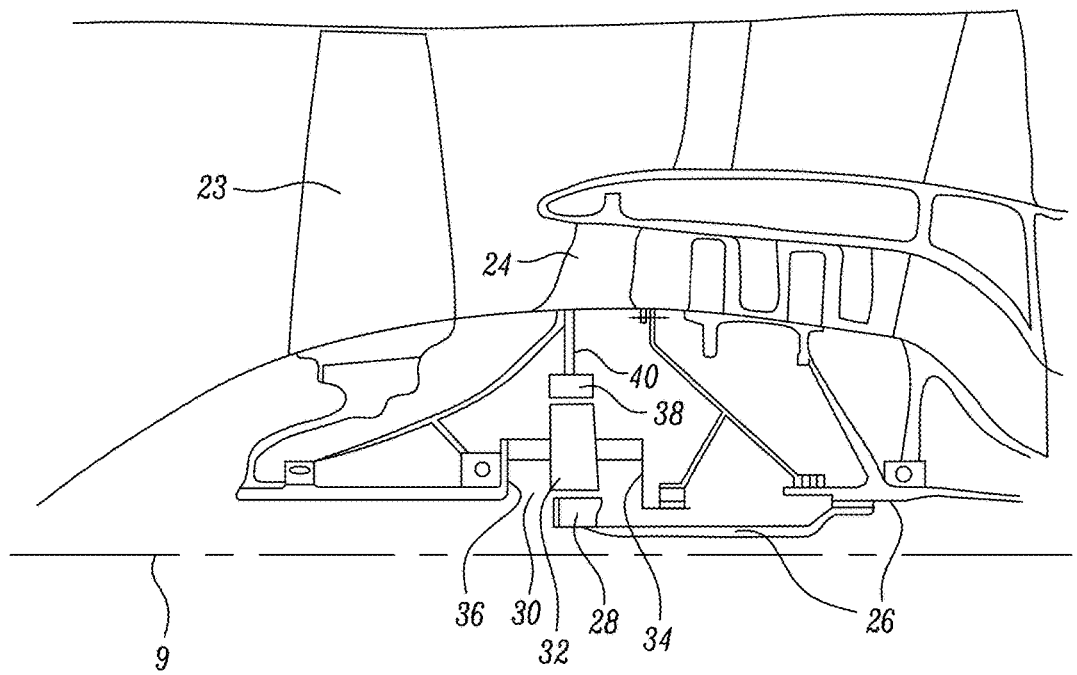
FIG. 2 is a close up sectional side view of an upstream portion of a gas turbine engine.

An exemplary arrangement for a geared fan gas turbine engine 10 is shown in FIG. 2. The low pressure turbine 19 (see FIG. 1) drives the shaft 26, which is coupled to a sun wheel, or sun gear, 28 of the epicyclic gear arrangement 30. Radially outwardly of the sun gear 28 and intermeshing therewith is a plurality of planet gears 32 that are coupled together by a planet carrier 34. The planet carrier 34 constrains the planet gears 32 to process around the sun gear 28 in synchronicity whilst enabling each planet gear 32 to rotate about its own axis. The planet carrier 34 is coupled via linkages 36 to the fan 23 in order to drive its rotation about the engine axis 9. Radially outwardly of the planet gears 32 and intermeshing therewith is an annulus or ring gear 38 that is coupled, via linkages 40, to a stationary supporting structure 24.

Note that the terms "low pressure turbine" and "low pressure compressor" as used herein may be taken to mean the lowest pressure turbine stages and lowest pressure compressor stages (i.e. not including the fan 23) respectively and/or the turbine and compressor stages that are connected together by the interconnecting shaft 26 with the lowest rotational speed in the engine (i.e. not including the gearbox output shaft that drives the fan 23). In some literature, the "low pressure turbine" and "low pressure compressor" referred to herein may alternatively be known as the "intermediate pressure turbine" and "intermediate pressure compressor". Where such alternative nomenclature is used, the fan 23 may be referred to as a first, or lowest pressure, compression stage.

Figure 3:
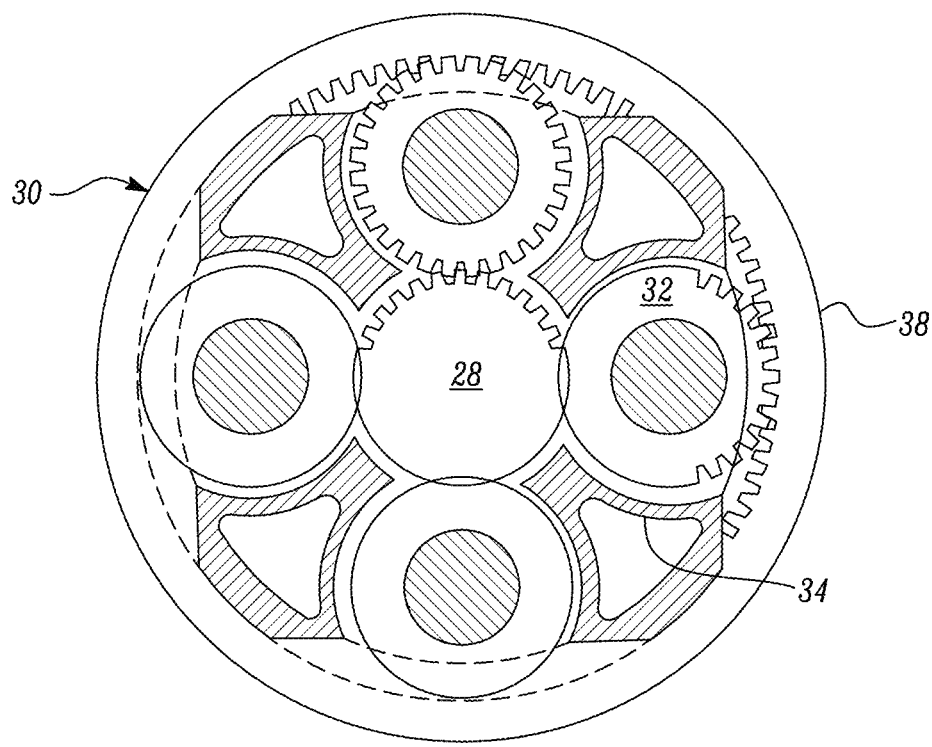
FIG. 3 is a partially cut-away view of a gearbox for a gas turbine engine.

The epicyclic gearbox 30 is shown by way of example in greater detail in FIG. 3. Each of the sun gear 28, planet gears 32 and ring gear 38 comprise teeth about their periphery to intermesh with the other gears. However, for clarity only exemplary portions of the teeth are illustrated in FIG. 3. There are four planet gears 32 illustrated, although it will be apparent to the skilled reader that more or fewer planet gears 32 may be provided within the scope of the claimed invention. Practical applications of a planetary epicyclic gearbox 30 generally comprise at least three planet gears 32.

The epicyclic gearbox 30 illustrated by way of example in FIGS. 2 and 3 is of the planetary type, in that the planet carrier 34 is coupled to an output shaft via linkages 36, with the ring gear 38 fixed. However, any other suitable type of epicyclic gearbox 30 may be used. By way of further example, the epicyclic gearbox 30 may be a star arrangement, in which the planet carrier 34 is held fixed, with the ring (or annulus) gear 38 allowed to rotate. In such an arrangement the fan 23 is driven by the ring gear 38. By way of further alternative example, the gearbox 30 may be a differential gearbox in which the ring gear 38 and the planet carrier 34 are both allowed to rotate.

It will be appreciated that the arrangement shown in FIGS. 2 and 3 is by way of example only, and various alternatives are within the scope of the present disclosure. Purely by way of example, any suitable arrangement may be used for locating the gearbox 30 in the engine 10 and/or for connecting the gearbox 30 to the engine 10. By way of further example, the connections (such as the linkages 36, 40 in the FIG. 2 example) between the gearbox 30 and other parts of the engine 10 (such as the input shaft 26, the output shaft and the fixed structure 24) may have any desired degree of stiffness or flexibility. By way of further example, any suitable arrangement of the bearings between rotating and stationary parts of the engine (for example between the input and output shafts from the gearbox and the fixed structures, such as the gearbox casing) may be used, and the disclosure is not limited to the exemplary arrangement of FIG. 2. For example, where the gearbox 30 has a star arrangement (described above), the skilled person would readily understand that the arrangement of output and support linkages and bearing locations would typically be different to that shown by way of example in FIG. 2.

Accordingly, the present disclosure extends to a gas turbine engine having any arrangement of gearbox styles (for example star or planetary), support structures, input and output shaft arrangement, and bearing locations.

Optionally, the gearbox may drive additional and/or alternative components (e.g. the intermediate pressure compressor and/or a booster compressor).

Other gas turbine engines to which the present disclosure may be applied may have alternative configurations. For example, such engines may have an alternative number of compressors and/or turbines and/or an alternative number of interconnecting shafts. By way of further example, the gas turbine engine shown in FIG. 1 has a split flow nozzle 18, 20 meaning that the flow through the bypass duct 22 has its own nozzle 18 that is separate to and radially outside the core engine nozzle 20. However, this is not limiting, and any aspect of the present disclosure may also apply to engines in which the flow through the bypass duct 22 and the flow through the core 11 are mixed, or combined, before (or upstream of) a single nozzle, which may be referred to as a mixed flow nozzle. One or both nozzles (whether mixed or split flow) may have a fixed or variable area. In some arrangements, the gas turbine engine 10 may not comprise a gearbox 30. Whilst one of the described example relates to a turbofan engine, the disclosure may apply, for example, to any type of gas turbine engine, such as an open rotor (in which the fan stage is not surrounded by a nacelle) or turboprop engine, for example, to a More Electric Aircraft (MEA), to a hybrid electric aircraft, to an electric aircraft, or to any heat sink or other heat exchanger, intended for any application (aerospace or not).

The geometry of the gas turbine engine 10, and components thereof, is defined by a conventional axis system, comprising an axial direction (which is aligned with the rotational axis 9), a radial direction (in the bottom-to-top direction in FIG. 1), and a circumferential direction (perpendicular to the page in the FIG. 1 view). The axial, radial and circumferential directions are mutually perpendicular.

Figure 4:
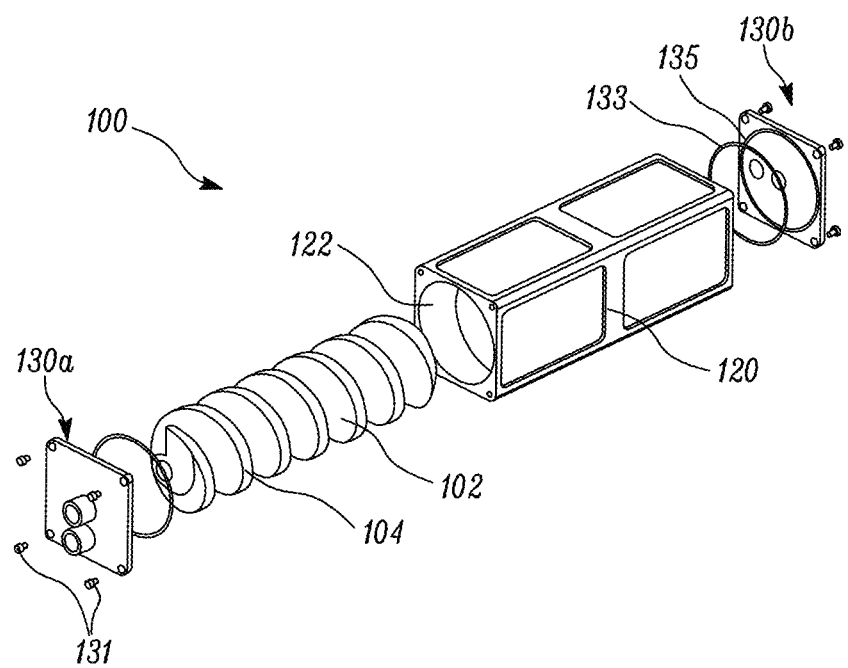
FIG. 4 is an exploded view of a counter-flow channel heat sink of an embodiment.

FIG. 4 illustrates a heat exchanger 100, which is arranged as a heat sink 100 in the embodiment being described. The heat sink 100 comprises a two-start helical baffle 102.

The heat exchanger 100 is described as a two-start helical heat exchanger 100 because two separate and concentric helical fluid flow paths 110, 112 are provided. The helical baffle 102 is arranged to provide the two helical fluid flow paths 110, 112. In the embodiment being described, the baffle 102 comprises a single-start helical thread 104; the heat exchanger 100 is described as a two-start heat exchanger 100 because the baffle 102 provides two helical paths—one within the thread 104 and one outside the thread—as described below.

The heat sink 100 comprises a casing 120. In the embodiment being described, the helical baffle 102 is arranged to be mounted within the casing 120, and more particularly mounted within and on the casing 120.

In the embodiment being described, the casing 120 is made of a thermally conductive material and is arranged to act as a heat spreader. The casing 120 may therefore also be referred to as a heat spreader 120.

In alternative embodiments, the casing 120 may not be arranged to act as a heat spreader; in such embodiments, the casing 120 may be made of a thermally insulating material. In such embodiments, the heat exchanger 100 may be arranged to transfer heat between the two helical fluid flow paths 110, 112, rather than to or from one or more heat sources or sinks located outside the casing.

In the embodiment being described, the casing/heat spreader 120 is arranged to enclose the baffle 102, and in particular is substantially cuboid in shape, with the helical baffle 102 arranged to extend along its length. The skilled person would appreciate that the casing 120 may be differently shaped—for example cylindrical, or a triangular, pentagonal, hexagonal or octagonal prism or the likes—in other embodiments. The shape of the casing 120 may be selected based on stacking or packaging requirements. The skilled person would appreciate that the shape of the casing 120 may be chosen to have flat external surfaces for ease of attachment of circuit boards and the likes, despite the curved shape of the baffle 102/the inner surface of the casing 122.

In the embodiment being described, the heat spreader 120 has a channel 122 therethrough; the helical baffle 102 is received within the channel 122 of the heat spreader 120. The channel 122 is arranged to extend along the length of the heat spreader 120, from one (in this embodiment, open) end region to a second (in this embodiment, open) end region.

In the embodiment being described, the channel 122 is at least substantially cylindrical and has a diameter selected to match that of the helical baffle 102 such that radial movement of the baffle 102 within the channel is limited or prevented.

In the embodiment being described, the helical baffle 102 has a cylindrical core 106 and a single thread 104, which extends around the cylindrical core 106.

In the embodiment being described, the helical baffle 102 is hollow. A first side, or surface, of the baffle 102 (the inside, in the embodiment being described) provides space for a first fluid to flow through the heat exchanger 100—the first fluid flow path 110 is therefore defined by the interior of the hollow baffle 102 in this embodiment.

In the embodiment being described, the single thread 104 is hollow.

In the embodiment being described, the core 106 is hollow at both end regions 106a,b of the baffle 102, but solid along the length of the baffle 102 therebetween. The hollow core regions 106a,b are in fluid communication with the hollow interior of the thread 104 and are arranged to provide an inlet and outlet for the first fluid. The first fluid flow path 110 is therefore defined by the hollow thread 104 and the hollow core regions 106a,b. In alternative embodiments, the core 106 may not have hollow regions and an inlet and outlet may be provided from the hollow thread 104 directly.

A second side, or surface, of the baffle (the outside, in the embodiment being described) provides space for a second fluid to flow through the heat exchanger 102—the second fluid flow path 112 is defined by the exterior surface of the baffle 102 and the interior of the casing 120 (the channel 122) in this embodiment.

Both flow paths 110, 112 are therefore helical in the embodiment being described, as their shapes are defined, at least in part, by the helical thread 104 of the baffle 102.

In alternative or additional embodiments, the helical baffle 102 may comprise two or more hollow threads 104, or a sub-division within the single hollow thread 104, such that two (or more) fluid flow paths may be provided inside the hollow baffle 104. The baffle 102 may have two separate internal surfaces in such embodiments, one providing the first surface and the other the second surface. In such embodiments, one or more further fluid flow paths may be provided outside of the baffle 102, between the baffle 102 and the casing 120.

In alternative embodiments, the helical baffle 102 may not be hollow—instead, a two-start helical thread could be provided, in which the two fluid flow paths are provided, separated by the threads and with the channel 122 defining the outer surface of each flow path. The baffle 102 may therefore have two or more threads 104, which may be parallel to each other. The baffle 102 may therefore comprise two or more helical external surfaces, which may be substantially U-shaped in cross-section, each surface extending from the peak of one thread to the peak of the adjacent thread.

In the embodiment being described, the first and second fluids are arranged to flow in a counter flow arrangement—i.e. if the first fluid flows from left to right along the first fluid flow path 110 as marked in FIG. 8B, the second fluid would flow from right to left along the second fluid flow path 112.

In the embodiment being described, separate inlets and outlets are provided for each fluid, as described below.

In the embodiment being described, both fluids come into heat exchange contact with the heat spreader 120, within which the heat exchanger 102 is mounted. In the embodiment being described, the first fluid makes thermal contact with the heat spreader 120 by thermal conduction through the baffle 102 and the second fluid makes direct thermal contact with the heat spreader 120 where it contacts the heat spreader 120, and may also make thermal contact by thermal conduction through the baffle 102

Heat is therefore exchanged between the heat spreader 120 and the first and second fluids, and between the first and second fluids themselves. A compact heat exchanger 100 is therefore provided, and the counter-flow arrangement may provide for more even cooling (or heating) of a component and/or of a fluid than prior art heat exchangers.

The heat exchanger 100 may therefore provide a lower thermal resistance than known heat exchangers due to the helical counter-flow arrangement and the thermal spreader casing 120 surrounding the helical flows. Further, heat exchangers 100 of various embodiments may be suitable for use in high temperature aerospace engine working conditions. The combination of the helical flow path design and the thermal spreader 120 may provide a higher heat transfer coefficient and higher thermal conductivity than known heat exchangers using the same coolant(s) and materials. For example, in some embodiments thermal resistance was found to be approximately 40% lower than that of currently available alternative heat exchangers using a highly viscous oil as the coolant (as both fluids/coolants for the heat exchanger 100).

The heat exchanger 100 of the embodiment being described additionally comprises two end-plates 130a,b. Each end plate 130 is arranged to be mounted at one open end face of the casing 120 and to seal that end face (i.e. one at each end of the channel 122). In alternative embodiments, the end plates 130 may be formed integrally with the baffle 102. In alternative or additional embodiments, one end plate 130 may be formed integrally with the casing 120, and the other formed integrally with the baffle 102, or separate from both baffle 102 and casing 120 and arranged to be mounted thereon.

The end plates 130 of the embodiment being described are at least substantially square, matching the end faces of the heat spreader 120. In alternative embodiments, their shapes may differ.

In the embodiment being described, each end plate 130 is arranged to be mounted on the heat spreader 120 by means of four screws 131. In this embodiment, the casing 120 comprises corresponding threaded mounting holes arranged to engagingly receive the screws 131. In the embodiment being described, an O-ring 133 is provided between the end plate 130 and the heat spreader 120 to provide a fluid-tight seal. A groove 135 is provided on the face of the end plate 130 arranged to make contact with the heat spreader 120 to aid in location and retention of the O-ring 133. An O-ring groove 135 is provided on the inner face of each end plate 130 in the embodiment shown.

In alternative or additional embodiments, further or different attachment and sealing means may be used instead of or as well as screws and an O-ring—for example, welding (e.g. once the baffle 102 has been inserted), clamps, an adhesive, electromagnets, or the likes may be used, and/or a different number of screws may be used. The skilled person would appreciate that any suitable approach known in the art may be used.

The end plates 130 with the O-ring seals 133 may make the casing 120 leak-proof—i.e. the second fluid of the embodiment being described may not be able to escape from or enter the channel 122 except via the openings described below.

Each end plate 130 of the embodiment being described comprises two openings 132, 134. The openings are arranged to act as inlet and outlet holes for the first and second fluid flows, and may be sized and positioned accordingly.

As the two fluids are arranged to be in counter-flow in the embodiment being described, one of the two openings 132a, 134b serves as an inlet for one fluid, and the other 132b, 134a as an outlet for the other fluid, in the embodiment being described.

In the embodiment being described, a first opening 132 of each end plate 130 is arranged to be located at least substantially centrally with respect to the helical baffle 102. In the embodiment being described, the helical baffle 102 is located at least substantially centrally with respect to the cylindrical channel 122 and the end plate 130 is located at least substantially centrally with respect to the cylindrical channel 122—the first opening is therefore located at least substantially centrally on the end plate 130.

In the embodiment being described, the first opening 132 of each end plate 130 is arranged to align with the core 106 of the baffle 102, and more specifically to align with and be in fluid contact with the hollow regions 106a,b of the core 106 which form the end portions of the first fluid flow path 110 (these may be described as providing an inlet 106a and outlet 106b to the hollow interior of the thread 104). The first openings 132 therefore provide the inlet 132a and outlet 132b for the first fluid. In alternative embodiments in which the core 106 does not have hollow regions and an inlet and outlet may be provided from the thread 104 directly, the inlet and outlet for the first fluid may not be central.

In the embodiment being described, a second opening 134 of each end plate 130 is arranged to be located offset from the centre/axis of the helical baffle 102, and therefore offset from the centre of the end plate 130 in the embodiment described.

In the embodiment being described, the second opening 134 of each end plate 130 is arranged to align with the space between the baffle 102 and the casing 120, and therefore to align with and be in fluid contact with the second fluid flow path 112. The second openings 134 therefore provide the inlet 134b and outlet 134a for the second fluid.

In the embodiment shown in FIG. 4, the inlet 132a and outlet 132b for the first fluid are aligned with the baffle axis (the centreline of the baffle core, marked "A" in FIG. 7B, which may be referred to as the heat exchanger axis) and with each other, whereas the inlet 134b and outlet 134a for the second fluid are located near different sides of their respective end plates 130, and so are not collinear. In alternative embodiments, the inlet 134b and outlet 134a for the second fluid may be collinear.

In the embodiment being described, the face of the end plate 130 arranged to lie away from the heat spreader 120 comprises two pipes 132, 134, one extending from each opening. The skilled person would appreciate that the provision of pipes integral with the end plate 130 may facilitate connection to fluid supply/exit pipes within a larger system. In alternative embodiments, no pipes may be provided and a connection may be made from apertures (optionally threaded apertures) providing the openings 132, 134. In alternative embodiments, one or both pipes may additionally or alternatively extend inwardly from the end plate 130.

In the embodiment being described, the face of the end plate 130 arranged to be in contact with the heat spreader 120 does not comprise pipes extending therefrom—the baffle 102 and casing 120 define the fluid flow paths within the casing 120.

In the embodiment being described, each fluid flows from one end of the heat exchanger 100 to the other once as it passes between its respective inlet and outlet. The heat exchanger 100 may therefore be described as a single pass heat exchanger, and the inlet for each fluid is on the far side of the heat exchanger from the outlet for that fluid. The heat exchanger 100 may comprise, or may be connected to, one or more pumps (not shown) arranged to pump the first and second fluids in counter-flow.

In the embodiment being described, the hollow regions 106a,b of the core 106 of the baffle 102 extend beyond the thread 104 of the baffle, so effectively providing one pipe 106a,b extending from the baffle 102 at each end. The single pass flow path arrangement for the first fluid is therefore able to be used for mounting the baffle 102 of this embodiment on the casing 120—the inlet 106a and outlet 106b hollow regions of the core are arranged and sized to be received in the inlet 132a and outlet 132b pipes of the end plates. The skilled person would appreciate that an equivalent arrangement could be provided by inwardly-directed pipes on the end plates 130 being received within the hollow core regions 106a,b, and that the core 106 may not extend beyond the thread 104 in such embodiments. Further, the same principles could be applied to pipes extending directly from the hollow thread 104 of the baffle, rather than from the core 106. In the embodiments being described, the pipes are circular in cross-section; in alternative embodiments, the pipes may be differently shaped.

In the embodiment being described, the heat exchanger 100 is therefore arranged to allow two fluids (two coolants) to pass therethrough, through independent, counter-flow, pathways 110, 112. The use of the hollow helical baffle 102 (as in the embodiment being described) or a dual-start thread helical baffle (in additional or alternative embodiments) in combination with the casing 120 provides the two (or more) helical pathways 110, 112 for the dual-coolant heat exchanger 100.

The use of dual coolants in a counter-flow arrangement may reduce the thermal resistance of the heat exchanger 100 as compared to known heat exchangers, and may provide a safer way to use fuel as a coolant in some embodiments.

The skilled person would appreciate that such a dual-channel arrangement may function in different ways, optionally simultaneously:

Firstly, two coolant fluids may be used to cool (or, in alternative implementations, heat) a component such as a power converter. The combined use of primary and secondary coolant flows may reduce the thermal resistance of the heat exchanger 100 in various embodiments.

The counter-flow arrangement for the two coolants may enable more even cooling of the component than is provided by single-coolant, or co-flow, systems.

Further, the use of two independent fluids for cooling a single component may improve fault tolerance of a thermal management system—for example enabling continued operation if the first or second coolant source develops a fault (e.g. a leak in a pipe or a problem in a pump). Each fluid flow path 110, 112 may be thought of as a back-up for the other in case of failure of the other—if one flow path becomes blocked or otherwise fails, the other can still provide cooling (or heating, as applicable). The skilled person would appreciate that improved tolerance may enable a power converter or other component to be heated or cooled to continue to operate at full power, or at reduced power, without disruption in operation, in scenarios in which failure of a single pump or pipe in a single-coolant systems would have necessitated a disruption in operation.

Secondly, the heat exchanger 100 may function as a fluid-to-fluid heat exchanger, heating one fluid and cooling the other. In some such embodiments, in which the heat exchanger 100 is arranged to be used purely as a fluid-to-fluid heat exchanger, the casing 120 may be selected to be insulating rather than thermally conducting, and so may not be described as a heat spreader.

In embodiments in which the heat exchanger 100 is used as a heat sink (or source) to cool (or heat) an external component, the casing 120 is thermally conductive (a heat spreader) and the fluid-to-fluid heat exchange may improve efficiency and/or evenness of the cooling (or heating) provided.

The concentric helical pathways may provide a compact heat exchanger design.

As an example, the first fluid could be an aero-lubricant oil/aviation fuel which could be cooled or heated using the second fluid within a thermal management system.

Such a system could be useful in a situation wherein a (first) fluid to be heated (or cooled) is incompatible with a liquid, system or component to be cooled (or heated)—e.g. due to health and safety or fire regulations requiring the system and fluid to be kept separate—the second fluid may be used as an intermediary, transferring heat from the liquid, system or component to the first fluid (or vice versa).

For example, aviation fuel may be used as a secondary coolant (second fluid) for a power component rather than the primary coolant (first fluid), potentially reducing risk of exposure to electronics and making the use of aviation fuel in a thermal management system more viable in certain safety-critical applications. Optionally, this approach could be used to pre-heat aviation fuel using the waste heat from system components.

In the embodiment being described, the casing 120 is designed to be relatively light-weight, as described below. The skilled person would appreciate that weight reduction may be of particular importance in aerospace and/or portable applications.

In the embodiment being described, the casing 120 is made of aluminium, and more specifically comprises aluminium plates. Aluminium was selected for this embodiment due to its relatively high thermal conductivity, and its relatively low density (for its strength). The skilled person would appreciate that metals or alloys may be used in many embodiments for their strength and thermal conductivity. However, in embodiments in which the heat exchanger 100 is to be used exclusively as a fluid-to-fluid exchanger rather than for exchange with an external heat source (e.g. a power converter) or sink, a thermally insulating material may be preferred (depending on ambient temperature as compared to the desired temperature, and other considerations).

In the embodiment being described, the casing 120 has a length of 23 cm (9") and a breadth and width of 8.4 cm (3.3"). A plate thickness of 0.64 cm (0.25") was used. The skilled person would appreciate that these dimensions are provided by way of example only, and that size, relative sizes, and thickness may differ in different embodiments, for example based on heat transfer calculations and/or on the size of a component to be heated or cooled; e.g. the casing 120 may not be square in cross-section. In various embodiments, the casing design may be adjusted according to the dimensions of components, e.g. power devices and capacitors, of a power converter or other system or component to be cooled.

In the embodiment being described, the channel 122 through the casing 120 is cylindrical and has a diameter of 7.5 cm (2.95"). This channel 122, along with the exterior of the baffle 102, defines the second fluid flow path 112 in the embodiment being described.

In the embodiment being described, the casing 120 is hollow, and a thermally conductive material 124 is provided within the casing to improve heat transfer and spreading (as shown in FIG. 6). The conductive material 124 may be selected to be lighter than the casing material (in this case, aluminium), such that the total weight is less than it would be for a solid casing. In the embodiment being described, graphite foam or annealed pyrolytic graphite 124 is provided within the casing, and in particular located along the edges of the casing 120, where the air-gap would otherwise be largest. In alternative embodiments, a solid casing 120 may be used, or no filler material may be added (e.g. relying on air/convection, and/or conduction via a longer route for heat transfer).

The skilled person would appreciate that the heat exchanger 100 of the embodiment being described may therefore be more lightweight and compact than known heat exchangers with the same heat transfer capacity, and that the reduced size and weight may be of particular benefit in aerospace applications, such as for cooling power converters in aircraft power systems. In particular, the arrangement of helical counter-flow paths 110, 112 provides a compact design and the, in this embodiment, hollow, aluminium casing 120 optionally containing porous graphite may reduce weight as compared to known approaches (generally using solid metal base plates in place of the hollow casing 120)—a weight reduction of around 60% was found for example embodiments.

In the embodiment being described, the casing 120 comprises indentations or grooves 128 on its faces oriented along the axis A of the baffle 102—these faces are the casing's longer faces in the embodiment shown in FIGS. 5A and 5B. These faces are substantially rectangular in the embodiments shown, with two indentations 128 on each face. The skilled person would appreciate that these indentations 128 may facilitate the arrangement of components to be cooled (or heated) on the heat exchanger 100, and/or mounting structures—e.g. the indentations 128—may be shaped and sized to receive power devices and/or other components for mounting, as illustrated by comparison of FIGS. 4 and 11. The indentations 128 may therefore have different shapes, sizes, orientations and/or locations in other embodiments.

The helical baffle 102 counter-flow design of various embodiments is now described in more detail with reference to FIGS. 7, 8 and 9.

In the embodiment being described, the hollow interior of the baffle 102 forms the first fluid flow path 110, which is connected to fluid supply lines via openings 132 in the end plates 130.

The helical baffle 102 and the cylindrical inner surface of the channel 122 of the casing 120 form the second fluid flow path 112, which is connected to fluid supply lines via openings 134 in the end plates 130.

Figure 9:
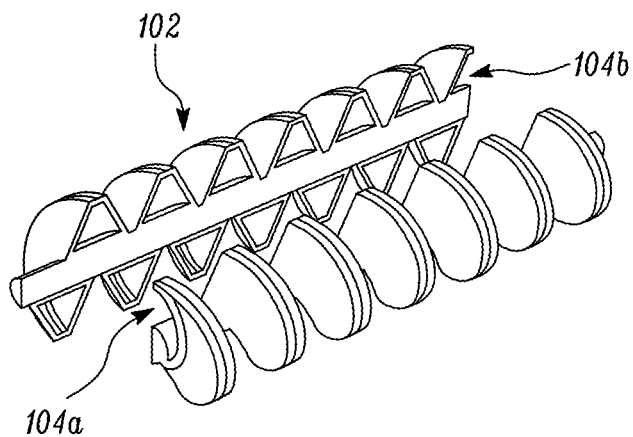
FIG. 9 is a perspective, exploded view of the helical baffle of the heat sink shown in FIG. 4, bisected along its length.
Figure 10A:
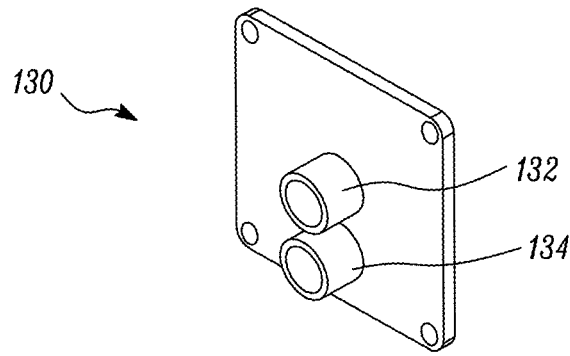
FIGS. 10A, 10B and 10C are perspective, front and back views of the end-plate of the heat sink shown in FIG. 4.
Figures 10B, 10C:
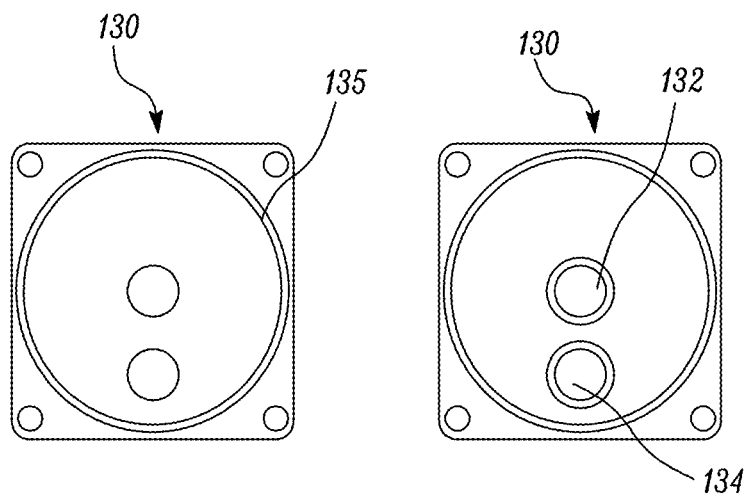

FIG. 9 illustrates an embodiment in which the core 106 is solid throughout, and the inlet and outlet for the first fluid path 110 are instead provided by open portions 104a, 104b of the thread 104. The cut section of the baffle 102 shown in FIG. 9 depicts these openings 104a,b into the hollow fluid path 110 within the baffle 102.

In FIG. 9, seams are shown along the thread 104 of the baffle 102, illustrating where components may be welded together to form a hollow baffle. The skilled person would appreciate that this is provided by way of example of a manufacturing approach only, and is not limiting. The baffle 102 may be formed integrally with the casing 120 in some embodiments.

The skilled person would appreciate that the diameter of the helical baffle 102 may be arranged to match the casing 120 design—it may be desirable to have the edge of the baffle 102 as close as practical to the component(s) to be heated or cooled (which may be arranged in the indentations 128 discussed above), and the diameter and pitch of the helical baffle 102 may be selected to provide thermal contact points with the inner surface of the casing 120 in the region of the component(s)—i.e. physical contact may be made between the helical baffle 102 and the casing 120, so allowing direct conduction of heat therebetween (without passing through a coolant around the baffle 102 first). Thermal contact points may be provided along the whole length of the baffle 102. The number of revolutions of the helix may also be selected based on component spacing, size, and/or location.

As thermal contact between the fluids and the casing 120 is provided on all sides of the casing (all four sides, in the embodiments being described), heat transfer can be provided all around the heat exchanger 100.

Considerations relating to the manufacturability of the baffle 102 in the desired material (e.g. Al or Cu) may also influence helix pitch selections.

The skilled person will appreciate that the non-linear, helical flow path may cause some turbulence in the flow—simulations were performed indicating that this imparted turbulence increased mixing of each fluid within its flow path 110, 112, so improving heat transfer.

Figure 15:
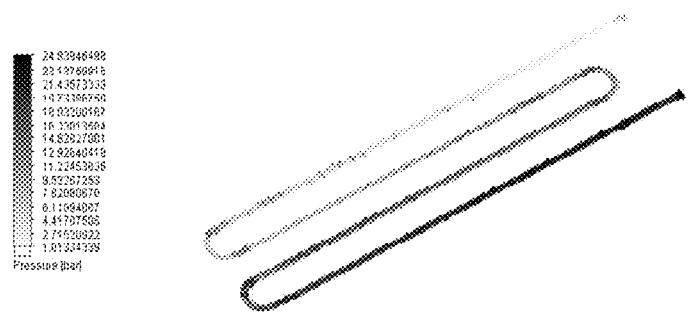
FIG. 15 illustrates pressure drop and a single flow line within a known plate heat exchanger.
Figure 16:
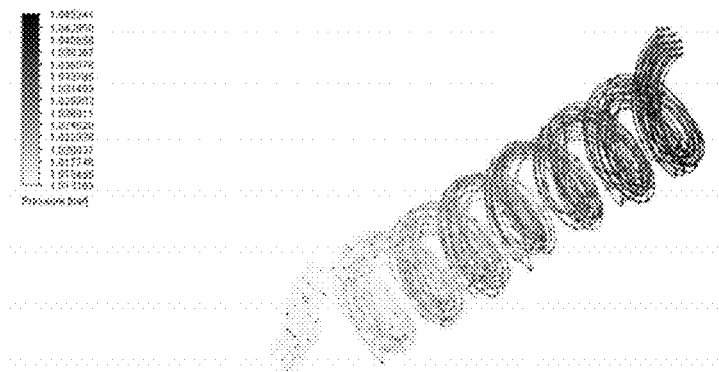
FIG. 16 illustrates pressure drop and multiple flow lines within a heat exchanger of an embodiment.

FIGS. 15 and 16 illustrate the difference in pressure drop and turbulence between a standard plate heat exchanger with a serpentine flow path (FIG. 15) and a helical flow heat exchanger of an embodiment (FIG. 16).

For the serpentine design, a pressure drop, dp=25 bar at a 7 litres per minute (lpm) oil flow rate (mass flow rate used for simulation). By contrast, for the helical flow path 110 the pressure drop dp=45 mbar at a 7 lpm oil flow rate (mass flow rate used for simulation).

Embodiments may therefore offer a negligible pressure drop (e.g. 45 mbar as compared to 25 bar) for the same flow rate, even when using a viscous coolant such as oil. The energy input for pumping the coolant through the heat exchanger 100 may therefore be reduced, improving overall efficiency. The skilled person would appreciate that the relatively high pumping power required for flow in a serpentine pipe design may discourage or preclude the use of a highly-viscous coolant, which may be a particular issue in aerospace applications in which the fluids available are often highly viscous. The reduction in pressure drop may also improve system level thermal performance.

Further, the multiple flow lines within the helical flow path as shown in FIG. 16 illustrate the turbulence of the flow of many embodiments. By contrast, flow within the serpentine design (FIG. 15) may be generally more linear. The turbulent flow may improve fluid mixing, thereby improving evenness of heat transfer, and improving heat transfer between the casing 120 and an inner fluid path in embodiments in which one (inner) fluid path is within the baffle 102 and another (outer) fluid path around the baffle 102.

Figure 11:
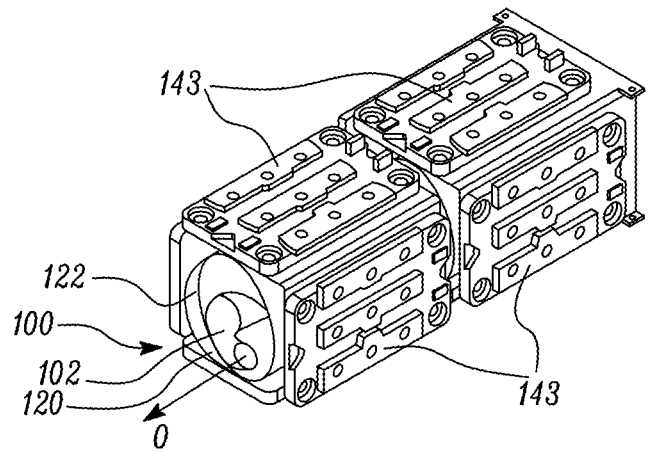
FIG. 11 is a perspective view of the heat sink shown in FIG. 4 assembled with power modules.
Figures 12A, 12B:
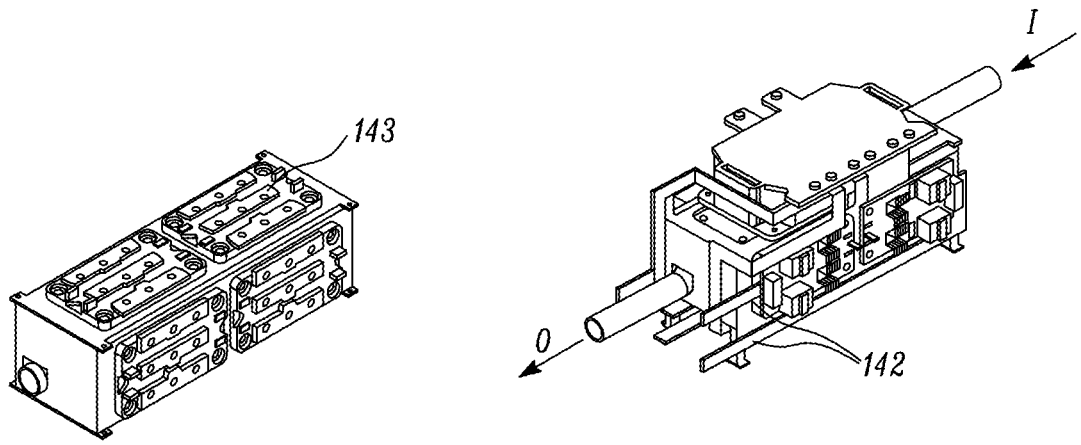
FIGS. 12A and 12B are perspective views of converter packaging for a heat sink of an embodiment, with and without circuitry, respectively.

FIGS. 11, 12 and 13 illustrate power converter packaging concepts using the heat exchanger 100 described above.

In particular, in embodiments in which the casing 120 of the heat exchanger 100 is a heat spreader, the ability to locate components to be cooled (or heated) all around the counter-flow helical heat exchanger 100 may allow components to be more efficiently and evenly cooled (or heated), and/or may allow more efficient use of space/denser packing of components without sacrificing heat exchange efficiency.

The arrangement illustrated in FIGS. 12A to 13B shows a packaging arrangement for a power converter. Modeling suggests that such an arrangement may increase, and may double in some embodiments, the power density as compared to known packaging arrangements for power converters with known heat exchangers.

In these Figures, arrows marked I and O indicate the inlet and outlet for one of the two coolants, respectively, and in particular for the inner fluid path in these embodiments (either fluid path may be arranged to flow in the marked direction in embodiments in which a dual-start helix provides two counterflow outer fluid paths). The skilled person would appreciate that this flow direction is provided by way of example only, to indicate the location and orientation of the baffle axis.

The converters 1100 shown in these figures comprise a chassis 1102 within which the heat exchanger 100 and converter components are contained. The heat exchanger 100 is arranged to act as a heat sink, cooling the converter 1100, in the embodiments shown.

The converters 1100 have a DC input (marked with arrow A) and an AC output (marked with arrow B) in the embodiments shown. In alternative embodiments, the converter 1100 may be an AC to AC converter, an AC to DC converter, or a DC to DC converter.

In embodiments in which a more efficient use of space/denser packing of components is obtained by using such a heat exchanger 100, the volumetric power density of the converter 1100 may be increased as compared to power converters with prior art heat exchangers due to the reduction in volume of the converter 1100.

The helical counter-flow design may allow this higher power density to be achieved even when using a highly viscous and/or relatively low thermal conductivity lubricant oil, which may not be suitable for use as a coolant in traditional heat sink designs. The heat exchanger 100, 200 may also be used as a pre-heater for aviation fuel, as explained above.

From an electrical perspective, the packaging arrangement illustrated in FIGS. 11 to 13 may offer various advantages in various embodiments, such as the possibility of mounting capacitors 1108 of the power converter 1100 in closer to high frequency switches 143 of the power converter 1100 than in known examples, as components may be mounted all around the heat exchanger 100 rather than only on one face. The skilled person would appreciate that reducing the spacing, and therefore the length of connectors, between or near high frequency switching power devices 143 and capacitors 1108 may beneficially reduce the inductance. The reduction in inductance may improve the switching efficiency and reduce losses.

Figure 13A:
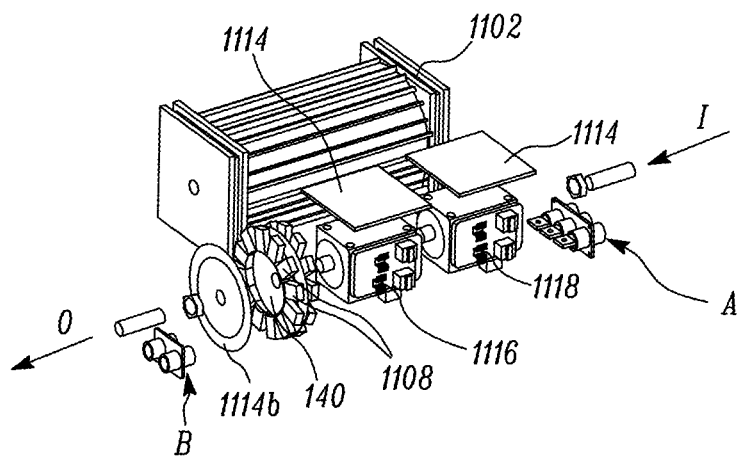
FIGS. 13A and 13B are perspective views of converter packaging for a heat sink of two alternative embodiments.
Figure 13B:
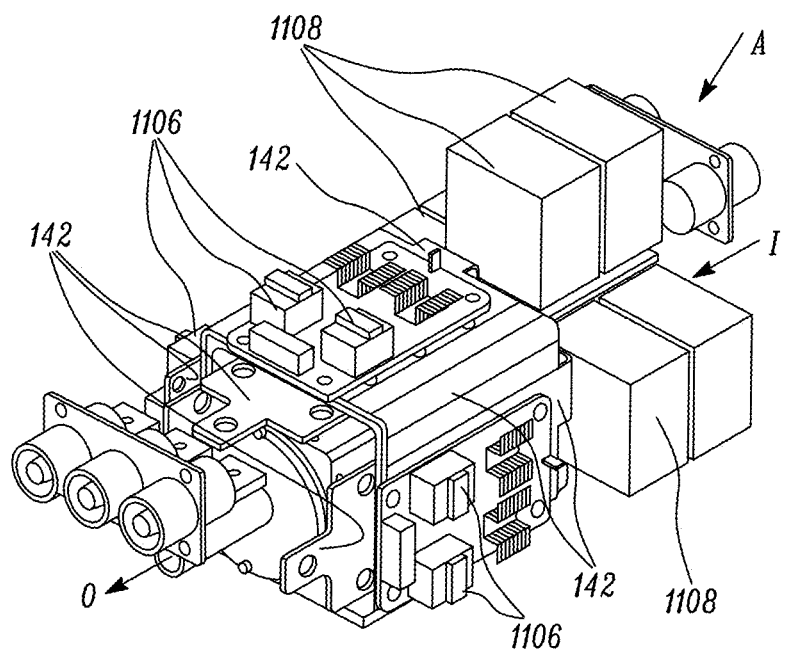

The ability to assemble capacitors 1108 in the vicinity of the high frequency switching devices 143, and for example to arrange the capacitors 1108 on circular printed circuit boards 140 (PCBs) shaped to fit around the heat exchanger axis, as shown in FIG. 13A, may improve packing density and/or reduce bus bar (or other connector) lengths. In alternative embodiments, such as that shown in FIG. 13B, the PCBs 140 may instead have rectangular regions arranged to fit on and around the heat exchanger axis, optionally with a flexible PCB harness between the regions, arranged to bend around the corners of the casing 120 (e.g. a PCB with four planar regions connected at right angles so as to surround a portion of a cuboid casing 120). The use of interconnected PCBs 140 on two or more, and optionally three or four, sides of the heat exchanger 100 may avoid a need for a larger, uni-planar PCB, so allowing for more compact converter packaging 1100.

This positioning of capacitors 1108 around the heat exchanger axis and near the high switching frequency devices 143 may additionally facilitate reducing weight of the power converters 1100, for example by reducing or eliminating bus bar requirements (as the distance for the relatively high currents to be conducted over may be decreased). More specifically, in various embodiments, dimensions of bus bars 142 may be reduced as compared to those required for a conventional packaging, since the capacitors (and/or other components to be connected) can be arranged closer to power devices.

SiC devices and gate drivers 1106 may likewise be assembled around the axis of the heat exchanger 100; i.e. on three, or all four, sides of the cuboid casing 120 in the embodiments shown in these figures. The SiC devices 1106 comprise Silicon Carbide (SiC) diodes and transistors in the embodiment shown; the skilled person would appreciate that different circuit components may be used instead of or as well as the SiC devices to perform an equivalent function in other embodiments.

Filter components (e.g. electromagnetic interference (EMI) filters, not shown) used in the power converter 1100 may also be cooled by the same, single-axis, heat exchanger 100, shared with switches and capacitors. Such components may be arranged on a circular PCB 140, as for the capacitors 1108 shown in FIG. 13A. The skilled person would appreciate that in conventional power converter packaging the filter design takes up a large proportion of the space and weight—in various embodiments, this proportion may be reduced. In particular, the packaging design of the EMI filters may be arranged around the same axis as the coolant flow/the heat exchanger axis, thus reducing requirements for additional fans or cooling systems for the filter. The single axis cooling provided by the helical flow paths may provide cooling for the filters in addition to other components.

Figure 14:
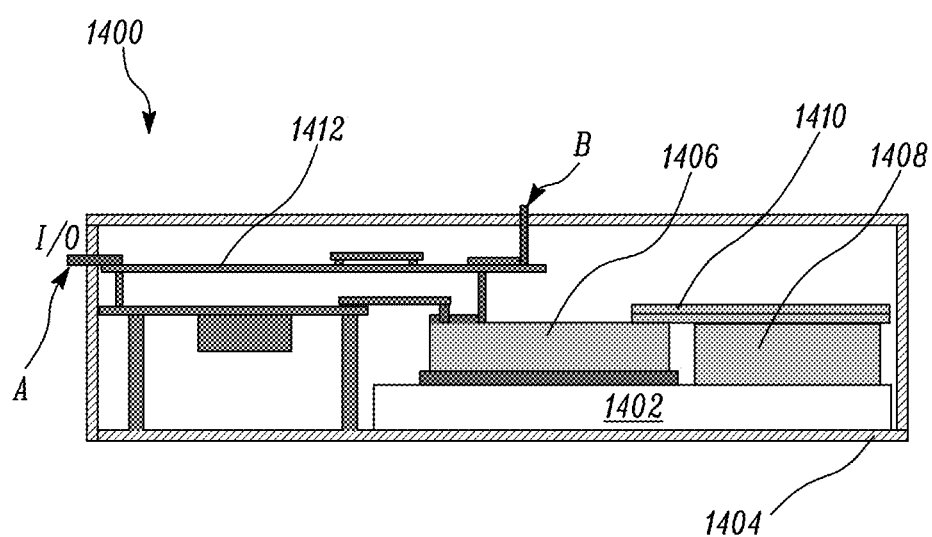
FIG. 14 illustrates a known example of converter packaging for a standard heat sink.

The conventional assembly of components on a conventional plate heat exchanger allows the assembly components in one plane only, thus tending to lead to electrical components being packaged in a bottom-up fashion as illustrated in FIG. 14. The conventional square, bottom-up assembly of components on a cold plate may be eliminated because of the circumferential cooling process—cooling is provided on all sides of the helical baffle 102 by embodiments described herein.

Arranging the filters around a common axis around which cooling is provided may be beneficial for efficient packaging, and may not be possible using known heat exchanger designs.

One or more control cards 1114 may be provided as controls for the switching of the power electronics. The one or more control cards 1114 may receive feedback from sensors on the heat exchanger 100 and/or elsewhere, monitoring the temperatures of the power devices, ambient temperature and coolant temperature(s)—the control cards 1114 may be arranged to alter power device performance based on temperature feedback, and/or to instruct a system to modify the temperature (e.g. by increasing or decreasing coolant flow rate) or raise an alarm (e.g. if temperature is dangerously high).

Control cards 1114 used for these concepts may also be designed to be circular 1114b to mount along with the other components. In the embodiment shown in FIG. 13A, two rectangular planar control cards 1114 and one circular planar control card 1114b are shown—the rectangular control cards 1114 are arranged to lie parallel to external surfaces of the casing 120 and to the heat exchanger axis whereas the circular control card is arranged to be mounted with the heat exchanger axis passing through its centre, and perpendicular to the heat exchanger axis.

In the embodiment shown in FIG. 13A, a first portion 1116 of the components mounted around the heat exchanger axis forms a Solid State Power Converter (SSPC) and a second portion 1118 of the components mounted around the heat exchanger axis forms an inverter. The skilled person would appreciate that different arrangements may be used in different embodiments, and that the assembly of FIG. 13A is provided by way of example only. Separate control cards 1114 are provided for each portion 1116, 1118 in the embodiment being described—in other embodiments, a single control card 1114 may control both portions, and/or the components may be divided into a different number of portions.

The skilled person would appreciate that the more efficient cooling that may be provided by the packaging arrangement in some embodiments may allow the power passing through a converter to be cooled to be increased, as the heat exchanger 100, 200 can meet the increased cooling load.

The casing 120 allows cooling to be provided around a central axis—rather than spread out over one large planar base plate as in known examples. Having one large planar base plate increases the average distance between components to be cooled as compared to embodiments disclosed herein. Taking the heat exchanger 100 as a part of the converter, the power density may be increased by reducing the overall volume as compared to prior art systems, as well as, or instead of, increasing the power throughput.

By contrast, a standard converter packaging 1400 is shown in FIG. 14. Arrow A indicates power entering the converter 1400 and Arrow B indicates power leaving the converter 1400. The converter comprises a cold plate 1402 mounted within a chassis 1404. The cold plate 1402 is a relatively flat cuboid with one face (one of the larger pair of faces, upward in the orientation shown) arranged for cooling components such as the SiC module 1406 and capacitors 1408 mounted thereon. The SiC module 1406 is a module comprising Silicon Carbide (SiC) diodes and transistors in the example shown. The capacitors 1408 may be DC link capacitors. The components 1406, 1408 are arranged to perform the power conversion, and are cooled by the cold plate 1402.

Components 1406, 1408 to be cooled are mounted only on a single face, not around the axis of the heat exchanger.

A DC bus bar 1410 and AC bus bar 1412 are also provided. The cold plate 1402 contains a serpentine pipe arrangement as illustrated in FIG. 15.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A two-start helical heat exchanger comprising:
    a helical baffle extending along a length of the heat exchanger and having first and second surfaces,
    a cylindrical core encircled by the helical baffle, and
    a casing within which the baffle is mounted;
    wherein the helical baffle is a hollow thread;
    wherein the first surface of the baffle is an interior surface of the baffle and is arranged to provide a first helical fluid flow path within the baffle for a first fluid;
    wherein the second surface of the baffle is an exterior surface of the baffle and is arranged to provide a second helical fluid flow path around the baffle for a second fluid, the second surface having a flat portion in direct thermal contact with an interior surface of the casing;
    wherein the cylindrical core is hollow at a first end to form a fluid inlet for the first fluid flow path, hollow at a second end to form a fluid outlet for the first fluid flow path, and solid between the two hollow ends; and
    wherein the baffle is arranged such that the first and second fluid flow paths are in thermal contact with each other through the baffle, the second fluid flow path is in direct thermal contact with the casing, and the first fluid flow path is in thermal contact with the casing through the baffle.

2. The heat exchanger of claim 1, wherein the first fluid is a flammable fluid and the second fluid is a non-flammable fluid, and optionally wherein the first fluid is aviation fuel or oil and the second fluid is water.

3. The heat exchanger of claim 1, wherein a space between the helical baffle and the casing provides the second fluid flow path.

4. The heat exchanger of claim 3, wherein the casing has a channel therethrough, and wherein the helical baffle is received within the channel such that the channel and the baffle together define the second fluid flow path.

5. The heat exchanger of claim 1, wherein the helical baffle comprises a single helical thread.

6. The heat exchanger of claim 1, wherein the casing is a heat spreader.

7. The heat exchanger of claim 1, wherein the heat exchanger is a heat sink arranged to cool a component outside of the casing, such as a power converter.

8. The heat exchanger claim 1, wherein the heat exchanger comprises one or more pumps, the one or more pumps being arranged to pump the first fluid through the first helical flow path in a first direction, and the second fluid through the second helical flow path in a second direction, wherein the second direction is opposed to the first direction.

9. A power converter comprising a heat exchanger according to claim 1, wherein the heat exchanger is arranged to serve as a heat sink to cool the power converter.

10. A gas turbine engine for an aircraft comprising:
    an engine core comprising a turbine, a compressor, and a core shaft connecting the turbine to the compressor;
    a fan located upstream of the engine core, the fan comprising a plurality of fan blades;
    a gearbox that receives an input from the core shaft and outputs drive to the fan so as to drive the fan at a lower rotational speed than the core shaft;
    so a power converter; and
    a heat exchanger according to claim 1, wherein the heat exchanger is arranged to serve as a heat sink to cool the power converter.

* * * * *